United States Patent
Tajima et al.

(10) Patent No.: US 9,530,767 B2
(45) Date of Patent: Dec. 27, 2016

(54) SEMICONDUCTOR LIGHT EMITTING ELEMENT

(71) Applicant: Kabushiki Kaisha Toshiba, Minato-ku (JP)

(72) Inventors: Jumpei Tajima, Mitaka (JP); Hiroshi Ono, Setagaya (JP); Shunsuke Asaba, Kawasaki (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/069,315

(22) Filed: Mar. 14, 2016

(65) Prior Publication Data

US 2016/0284685 A1    Sep. 29, 2016

(30) Foreign Application Priority Data

Mar. 23, 2015 (JP) ................................ 2015-060064

(51) Int. Cl.

| H01L 21/336 | (2006.01) |
| H01L 27/02 | (2006.01) |
| H01L 33/06 | (2010.01) |
| H01L 33/32 | (2010.01) |

(Continued)

(52) U.S. Cl.
CPC ......... *H01L 27/0255* (2013.01); *H01L 25/167* (2013.01); *H01L 33/06* (2013.01); *H01L 33/32* (2013.01); *H01L 33/62* (2013.01)

(58) Field of Classification Search
None
See application file for complete search history.

(56) References Cited

U.S. PATENT DOCUMENTS

| 2003/0001170 A1* | 1/2003 | Shibata | .................. | B82Y 20/00 |
| | | | | 257/189 |
| 2007/0164296 A1* | 7/2007 | Miki | ....................... | H01L 33/32 |
| | | | | 257/86 |

(Continued)

FOREIGN PATENT DOCUMENTS

| JP | 2011-528855 A | 11/2011 |
| JP | 2012-510173 | 4/2012 |

*Primary Examiner* — Thao P Le
(74) *Attorney, Agent, or Firm* — Oblon, McClelland, Maier & Neustadt, L.L.P.

(57) ABSTRACT

According to one embodiment, a semiconductor light emitting element includes a base body, first to sixth semiconductor layers, a first conductive layer, and a first pad layer. The first semiconductor layer is separated from the base body and includes first and second semiconductor regions arranged with each other. The second semiconductor layer is provided between the second semiconductor region and the base body. The third semiconductor layer is provided between the second semiconductor region and the second semiconductor layer. The fourth semiconductor layer is separated from the base body, arranged with the first semiconductor layer. The fifth semiconductor layer is provided between the base body and one portion of the fourth semiconductor layer. The sixth semiconductor layer is provided between the fifth semiconductor layer and the one portion. The first conductive layer includes first, second, and third conductive regions. The first pad layer includes a first pad region.

20 Claims, 6 Drawing Sheets

(51) Int. Cl.
*H01L 33/62* (2010.01)
*H01L 25/16* (2006.01)

(56) References Cited

U.S. PATENT DOCUMENTS

| | | | |
|---|---|---|---|
| 2008/0149918 A1* | 6/2008 | Yoo | H01L 33/32 257/17 |
| 2009/0321738 A1* | 12/2009 | Kim | B82Y 10/00 257/59 |
| 2011/0233646 A1 | 9/2011 | Mizushima et al. | |
| 2011/0260205 A1 | 10/2011 | Moosburger et al. | |
| 2012/0018763 A1 | 1/2012 | Engl et al. | |
| 2012/0161113 A1* | 6/2012 | Lowenthal | H01L 25/048 257/40 |

* cited by examiner

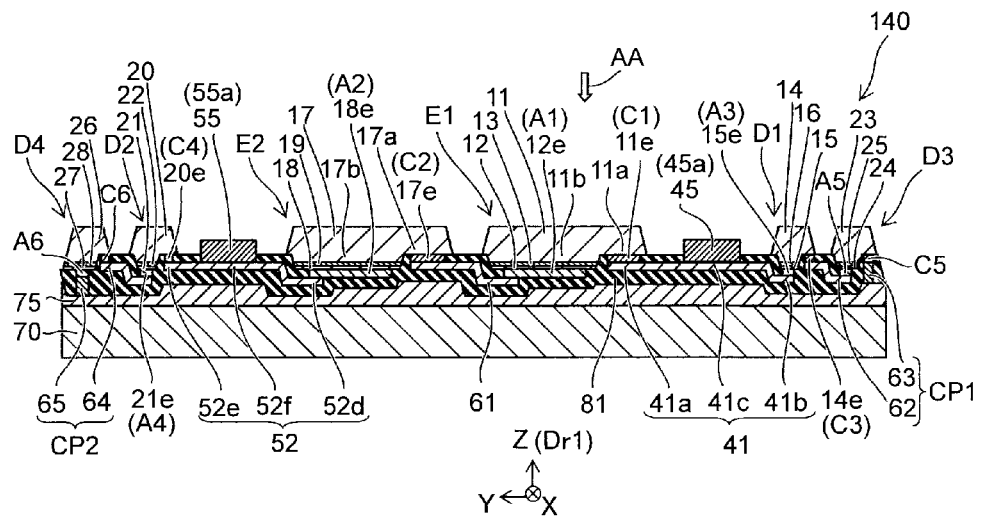
FIG. 6A
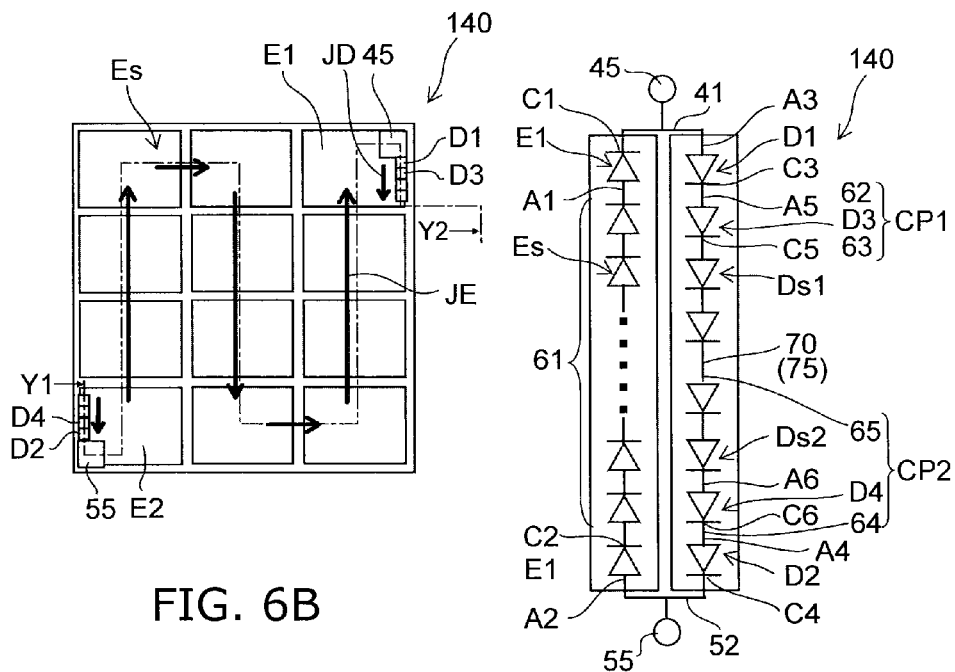
FIG. 6B
FIG. 6C

SEMICONDUCTOR LIGHT EMITTING ELEMENT

CROSS-REFERENCE TO RELATED APPLICATIONS

This application is based upon and claims the benefit of priority from Japanese Patent Application No.2015-060064, filed on Mar. 23, 2015; the entire contents of which are incorporated herein by reference.

FIELD

Embodiments described herein relate generally to a semiconductor light emitting element.

BACKGROUND

There is a semiconductor light emitting element such as a light emitting diode (LED) or the like that uses a nitride semiconductor such as gallium nitride, etc. Breakdown may occur when a reverse voltage such as static electricity or the like is applied to the semiconductor light emitting element. It is desirable for the semiconductor light emitting element to have high reliability.

BRIEF DESCRIPTION OF THE DRAWINGS

FIG. 6A to FIG. 6C are schematic plan views showing a semiconductor light emitting element according to a fourth embodiment.

DETAILED DESCRIPTION

Figure 1A:
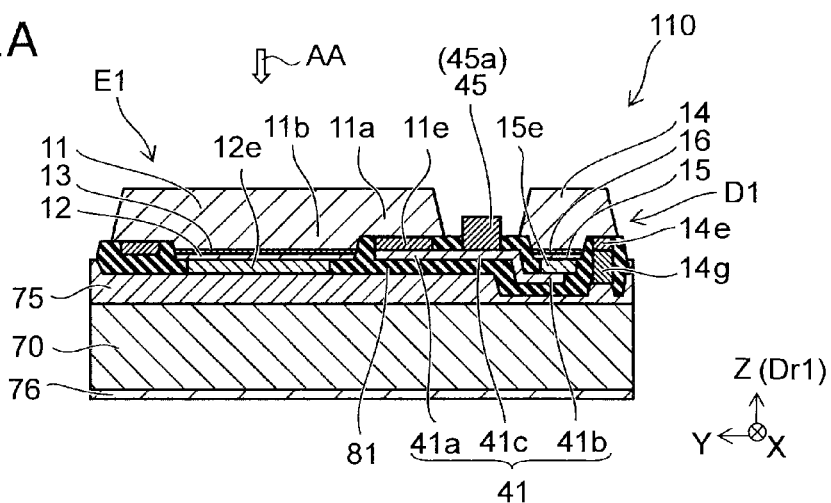
FIG. 1A to FIG. 1C are schematic plan views showing a semiconductor light emitting element according to a first embodiment.

According to one embodiment, a semiconductor light emitting element includes a conductive base body, first to sixth semiconductor layers, a first conductive layer, and a first pad layer. The first semiconductor layer is separated from the base body in a first direction and is of a first conductivity type. The first semiconductor layer includes a first semiconductor region and a second semiconductor region. The second semiconductor region is arranged with the first semiconductor region in a second direction intersecting the first direction. The second semiconductor layer is provided between the second semiconductor region and the base body, electrically connected to the base body, and of a second conductivity type. The third semiconductor layer is provided between the second semiconductor region and the second semiconductor layer. The fourth semiconductor layer is separated from the base body in the first direction, arranged with the first semiconductor layer in a third direction, electrically connected to the base body, and of the first conductivity type. The third direction intersects the first direction. The fifth semiconductor layer is provided between the base body and one portion of the fourth semiconductor layer, and of the second conductivity type. The sixth semiconductor layer is provided between the fifth semiconductor layer and the one portion of the fourth semiconductor layer. The first conductive layer electrically connects the first semiconductor region to the fifth semiconductor layer and includes a first conductive region, a second conductive region, and a third conductive region. The first conductive region is provided between the first semiconductor region and the base body. The second conductive region is provided between the fifth semiconductor layer and the base body. The third conductive region is provided between the first conductive region and the second conductive region. The first pad layer includes a first pad region. The third conductive region is disposed between the first pad region and the base body. The first pad region is electrically connected to the third conductive region. The first pad region is disposed between the first semiconductor layer and the fourth semiconductor layer.

According to another embodiment, a semiconductor light emitting element includes a conductive base body, first to sixth semiconductor layers, a second conductive layer, and a second pad layer. The first semiconductor layer is separated from the base body in a first direction, electrically connected to the base body, and of a first conductivity type. The first semiconductor layer includes a first semiconductor region and a second semiconductor region. The second semiconductor region is arranged with the first semiconductor region in a second direction intersecting the first direction. The second semiconductor layer is provided between the second semiconductor region and the base body, and of a second conductivity type. The third semiconductor layer is provided between the second semiconductor region and the second semiconductor layer. The fourth semiconductor layer is separated from the base body in the first direction, arranged with the first semiconductor region in a third direction intersecting the first direction, and of the first conductivity type. The fifth semiconductor layer is provided between the base body and one portion of the fourth semiconductor layer, electrically connected to the base body, and of the second conductivity type. The sixth semiconductor layer is provided between the fifth semiconductor layer and the one portion of the fourth semiconductor layer. The second conductive layer electrically connects the second semiconductor layer to the fourth semiconductor layer and includes a fourth conductive region, a fifth conductive region, and a sixth conductive region. The fourth conductive region is provided between the second semiconductor layer and the base body. The fifth conductive region is provided between the base body and one other portion of the fourth semiconductor layer. The sixth conductive region is provided between the fourth conductive region and the fifth conductive region. The second pad layer includes a third pad region. The sixth conductive region is disposed between the third pad region and the base body. The third pad region is electrically connected to the sixth conductive region. The third pad region is disposed between the first semiconductor layer and the fourth semiconductor layer.

According to another embodiment, a semiconductor light emitting element includes a conductive base body, first to sixth semiconductor layers, a second conductive layer, and a second pad layer. The first semiconductor layer is separated from the base body in a first direction, electrically connected to the base body, and of a first conductivity type. The first semiconductor layer includes a first semiconductor region and a second semiconductor region. The second semiconductor region is arranged with the first semiconductor region in a second direction intersecting the first direction. The second semiconductor layer is provided between the second semiconductor region and the base body, and of a second conductivity type. The third semiconductor layer is provided between the second semiconductor region and the second semiconductor layer. The fourth semiconductor layer is separated from the base body in the first direction, arranged with the first semiconductor region in a third direction intersecting the first direction, and of the first conductivity type. The fifth semiconductor layer is provided between the base body and one portion of the fourth semiconductor layer, electrically connected to the base body, and of the second conductivity type. The sixth semiconductor layer is provided between the fifth semiconductor layer and the one portion of the fourth semiconductor layer. The second conductive layer electrically connects the second semiconductor layer to the fourth semiconductor layer and includes a fourth conductive region and a fifth conductive region. The fourth conductive region is provided between the second semiconductor layer and the base body. The second pad layer includes a third pad region and a fourth pad region. The fifth conductive region is disposed between the third pad region and the base body. The third pad region is electrically connected to the fifth conductive region. The third pad region is disposed between the first semiconductor layer and the fourth semiconductor layer. At least one portion of the fourth semiconductor layer is disposed between the second pad region and the base body.

According to another embodiment, a semiconductor light emitting element includes a base body, first and second light emitting units, a first diode, a second diode, first and second conductive layers, first and second pad layers, a first insulating layer, and first and second connection units. The first light emitting unit is provided on the base body, and includes a first anode and a first cathode. The second light emitting unit is provided on the base body, and includes a second anode and a second cathode. The first diode is provided on the base body, and includes a third anode and a third cathode. The second diode is provided on the base body, and includes a fourth anode and a fourth cathode. The first conductive layer electrically connects the first cathode to the third anode and includes a first conductive region, a second conductive region, and a third conductive region. The third conductive region is disposed between the first conductive region and the second conductive region. The first conductive region is disposed between the first cathode and the base body. The second conductive region is disposed between the third anode and the base body. The second conductive layer electrically connects the second anode to the fourth cathode and includes a fourth conductive region, a fifth conductive region, and a sixth conductive region. The sixth conductive region is disposed between the fourth conductive region and the fifth conductive region. The fourth conductive region is disposed between the second anode and the base body. The fifth conductive region is disposed between the fourth cathode and the base body. The third conductive region is disposed between the first pad layer and the base body. The first pad layer is electrically connected to the third conductive region. The sixth conductive region is disposed between the second pad layer and the base body. The second pad layer is electrically connected to the sixth conductive region. The first insulating layer is provided between the first conductive layer and the base body and between the second conductive layer and the base body. The first connection unit electrically connects the third cathode to the base body. The second connection unit electrically connects the fourth cathode to the base body.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

Figure 1B:
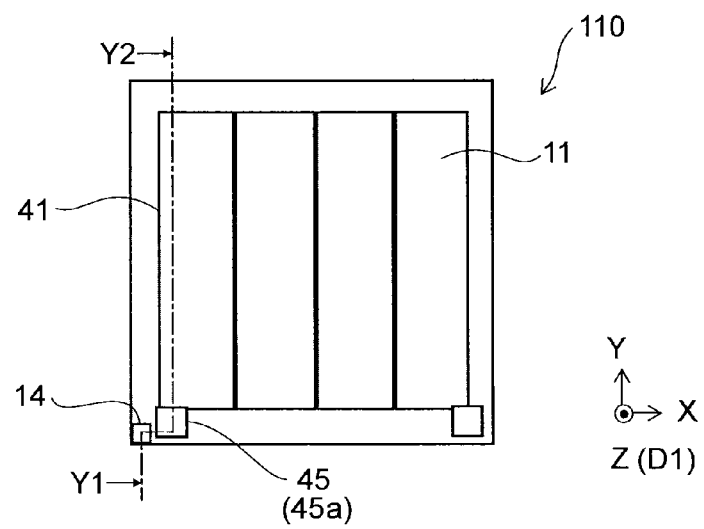
Figure 1C:
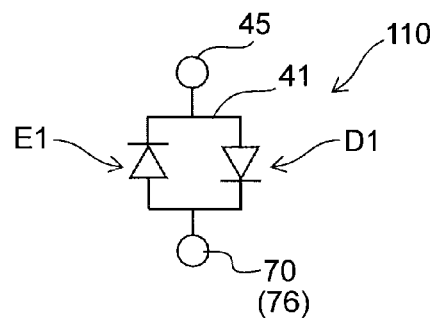

FIG. 1A to FIG. 1C are schematic plan views illustrating a semiconductor light emitting element according to a first embodiment.

FIG. 1A is a cross-sectional view along line Y1-Y2 of FIG. 1B. FIG. 1B is a plan view as viewed along arrow AA of FIG. 1A. FIG. 1C is an equivalent circuit diagram.

As shown in FIG. 1A and FIG. 1B, the semiconductor light emitting element 110 according to the embodiment includes a base body 70, first to sixth semiconductor layers 11 to 16, a first conductive layer 41, and a first pad layer 45.

The base body 70 is conductive. The base body 70 includes, for example, a semiconductor substrate (e.g., a silicon substrate, etc.). The base body 70 may include a metal layer.

The first semiconductor layer 11 is separated from the base body 70 in a first direction Dr1.

For example, a direction (the first direction Dr1) from the base body 70 toward the first semiconductor layer 11 is taken as a Z-axis direction. One axis perpendicular to the Z-axis direction is taken as an X-axis direction. A direction perpendicular to the Z-axis direction and the X-axis direction is taken as a Y-axis direction.

The first semiconductor layer 11 is of a first conductivity type. The first semiconductor layer 11 includes a first semiconductor region 11a and a second semiconductor region 11b. The second semiconductor region 11b is arranged with the first semiconductor region 11a in a second direction intersecting the first direction Dr1.

A second semiconductor layer 12 is provided between the second semiconductor region 11b and the base body 70. The second semiconductor layer 12 is electrically connected to the base body 70. The second semiconductor layer 12 is of a second conductivity type.

For example, the first conductivity type is an n-type; and the second conductivity type is a p-type. In the embodiment, the first conductivity type may be the p-type; and the second conductivity type may be the n-type. Hereinbelow, the first conductivity type is taken to be the n-type; and the second conductivity type is taken to be the p-type.

A third semiconductor layer 13 is provided between the second semiconductor region 11b and the second semiconductor layer 12. The third semiconductor layer 13 is, for example, a light emitting layer. The third semiconductor layer 13 includes, for example, a well layer.

The first semiconductor layer 11 includes, for example, an n-type GaN layer. The second semiconductor layer 12 includes, for example, a p-type GaN layer. The well layer that is included in the third semiconductor layer 13 includes, for example, an InGaN layer.

The n-type impurity includes, for example, at least one of Si, Ge, Te, or Sn. The p-type impurity includes, for example, at least one of Mg, Zn, or C.

A fourth semiconductor layer 14 is separated from the base body 70 in the first direction Dr1. At least one portion of the fourth semiconductor layer 14 is arranged with at least one portion of the first semiconductor layer 11 in a third direction intersecting the first direction Dr1. The fourth semiconductor layer 14 is electrically connected to the base body 70. The fourth semiconductor layer 14 is of the first conductivity type.

A fifth semiconductor layer 15 is provided between the base body 70 and one portion of the fourth semiconductor layer 14. The fifth semiconductor layer 15 is of the second conductivity type.

The sixth semiconductor layer 16 is provided between the fifth semiconductor layer 15 and the one portion of the fourth semiconductor layer 14 recited above.

The fourth semiconductor layer 14 includes a material similar to the material included in the first semiconductor layer 11. The fifth semiconductor layer 15 includes a material similar to the material included in the second semiconductor layer 12. The sixth semiconductor layer 16 includes a material similar to the material included in the third semiconductor layer 13.

The first conductive layer 41 includes a first conductive region 41a, a second conductive region 41b, and a third conductive region 41c. The first conductive region 41a is provided between the first semiconductor region 11a and the base body 70. The second conductive region 41b is provided between the fifth semiconductor layer 15 and the base body 70. The third conductive region 41c is provided between the first conductive region 41a and the second conductive region 41b. The first conductive layer 41 electrically connects the first semiconductor region 11a to the fifth semiconductor layer 15.

The first pad layer 45 includes a first pad region 45a. The third conductive region 41c is disposed between the first pad region 45a and the base body 70. The first pad region 45a is electrically connected to the third conductive region 41c.

A first insulating layer 81, a metal layer 75, and a metal film 76 are further provided in the example.

The first insulating layer 81 is provided between the first conductive layer 41 and the base body 70. The first insulating layer 81 electrically insulates the first conductive layer 41 from the base body 70. The first insulating layer 81 includes, for example, a compound including at least one of silicon or aluminum. The first insulating layer 81 includes, for example, at least one of silicon oxide, silicon nitride, or silicon oxynitride. The first insulating layer 81 may include a stacked film.

The metal layer 75 is provided between the first insulating layer 81 and the base body 70. For example, the metal layer 75 bonds the first insulating layer 81 to the base body 70. The metal layer 75 is, for example, a bonding layer. The metal layer 75 includes, for example, solder. The metal layer 75 is electrically connected to the base body 70.

The base body 70 is provided between the metal film 76 and the metal layer 75. The metal film 76 is used as one electrode of the semiconductor light emitting element 110. The metal film 76 is electrically connected to the base body 70.

The first to third semiconductor layers 11 to 13 are included in a first light emitting unit E1. The first light emitting unit E1 is a first LED. An electrode 11e and an electrode 12e are provided in the example. The electrode 11e is provided between the first semiconductor region 11a and the first conductive region 41a. For example, the electrode 11e is used as the cathode of the first light emitting unit E1. The electrode 12e is provided between the second semiconductor layer 12 and the base body 70. For example, the electrode 12e is used as the anode of the first light emitting unit E1.

The fourth to sixth semiconductor layers 14 to 16 are included in a first diode D1. An electrode 14e and an electrode 15e are provided in the example. The electrode 14e is provided between the base body 70 and one other portion of the fourth semiconductor layer 14. For example, the electrode 14e is used as the cathode of the first diode D1. The electrode 15e is provided between the fifth semiconductor layer 15 and the base body 70. For example, the electrode 15e is used as the anode of the first diode D1.

A conductive unit 14g is provided between the electrode 14e and the base body 70. The conductive unit 14g electrically connects the electrode 14e to the base body (the metal layer 75).

As shown in FIG. 1C, the cathode of the first light emitting unit E1 is electrically connected to the anode of the first diode D1 by the first conductive layer 41. The anode of the first light emitting unit E1 is electrically connected to the cathode of the first diode by the base body 70. The metal film 76 (the base body 70) is used as the anode electrode of the semiconductor light emitting element 110. The first pad layer 45 is used as the cathode electrode of the semiconductor light emitting element 110.

In the operation of the semiconductor light emitting element 110, a voltage is applied between the metal film 76 (the base body 70) and the first pad layer 45. A current is supplied to the first light emitting unit E1 from the metal film 76 (the base body 70) toward the first pad layer 45; and light is emitted from the first light emitting unit E1. The peak wavelength of the light (the emitted light) emitted from the first light emitting unit E1 is, for example, not less than 400 nanometers (nm) and not more than 650 nm. In the embodiment, the peak wavelength is arbitrary. The intensity of the emitted light is highest at the peak wavelength.

On the other hand, there are cases where the potential of the first pad layer 45 is higher than the potential of the metal film 76 (the base body 70) due to static electricity, lightning, etc. In other words, there are cases where a reverse voltage is applied. The current due to the reverse voltage flows through the first diode D1. The first diode D1 functions as a protection circuit. Thereby, the breakdown of the first light emitting unit E1 is suppressed.

In the embodiment as shown in FIG. 1A and FIG. 1B, the first pad layer 45 (the first pad region 45a) is disposed between the first semiconductor layer 11 and the fourth semiconductor layer 14.

For example, the first light emitting unit E1 is provided mainly in the central portion of the chip of the semiconductor light emitting element 110. On the other hand, the first diode D1 that functions as the protection circuit is provided in the edge portion of the chip. The first pad layer 45 is disposed between the first diode D1 and the first light emitting unit E1.

There is a tendency for the crystal quality to be poor at the edge portion of the chip caused by dividing the chips, etc. The current density is lower in the edge portion of the chip than in the chip center. For example, there is a configuration in which a current blocking layer is provided at the pad vicinity to suppress current concentration in the pad unit that may shield the emitted light. In such a configuration, the current injected into the light emitting layer at the pad vicinity is particularly small.

Accordingly, by providing the first light emitting unit E1 mainly in the central portion of the chip, it is easy to obtain a high luminous efficiency in the first light emitting unit E1. On the other hand, because the first diode D1 has a configuration similar to that of the first light emitting unit E1, the light that is emitted from the first light emitting unit E1 may be absorbed by the first diode D1. The absorption can be suppressed by increasing the distance between the first diode D1 and the first light emitting unit E1. By disposing the first pad layer 45 between the first diode D1 and the first light emitting unit E1, the surface area of the portion of the chip that emits light can be enlarged while suppressing the absorption. Thereby, the characteristics such as the luminous efficiency, light extraction efficiency, etc., can be improved.

In the example shown in FIG. 1A to FIG. 1C, one first diode D1 is provided for one first pad layer 45. In the embodiment, multiple first pad layers 45 may be included in one chip of the semiconductor light emitting element 110. In such a case, multiple first diodes D1 may be provided. One of the multiple first diodes D1 may be provided for one of the first pad layers 45. Two or more of the multiple first diodes D1 may be provided for one first pad layer 45. The multiple first diodes D1 may be provided respectively for the multiple first pad layers 45. The first diode D1 may not be provided for one of the multiple first pad layers 45. By providing the multiple first diodes D1 in one chip, for example, the balance of the light emission in the surface is improved. The surface area of one first diode D1 can be reduced; and the reabsorption of the emitted light can be suppressed.

Thus, in the embodiment, the immunity to the reverse voltage can be improved while suppressing the degradation of the characteristics. According to the embodiment, a semiconductor light emitting element having higher reliability can be provided.

For example, the semiconductor light emitting element 110 is made as follows.

A semiconductor film that is used to form the first semiconductor layer 11 and the fourth semiconductor layer 14 is formed on a substrate (not shown). A semiconductor film that is used to form the third semiconductor layer 13 and the sixth semiconductor layer 16 is formed on the semiconductor film used to form the first semiconductor layer 11 and the fourth semiconductor layer 14. A semiconductor film that is used to form the second semiconductor layer 12 and the fifth semiconductor layer 15 is formed on the semiconductor film used to form the third semiconductor layer 13 and the sixth semiconductor layer 16. On the semiconductor film used to form the second semiconductor layer 12 and the fifth semiconductor layer 15, the electrodes are formed; and the first insulating layer 81 is formed. A metal film that is used to form one portion of the metal layer 75 is formed on the electrodes and the first insulating layer 81. On the other hand, a structure body is prepared that includes the base body 70 and a metal film used to form one other portion of the metal layer 75. The metal films are bonded to each other. After the bonding, the first semiconductor layer 11 and the fourth semiconductor layer 14 are obtained by patterning the semiconductor film used to form the first semiconductor layer 11 and the fourth semiconductor layer 14. Subsequently, the first pad layer 45 is formed. Thereby, the semiconductor light emitting element 110 is obtained. The substrate recited above includes, for example, one of Si, $SiO_2$, quartz, sapphire, GaN, SiC, or GaAs. The method for depositing the semiconductor film includes, for example, metal-organic chemical vapor deposition (MOCVD), metal-organic vapor phase epitaxy, etc.

Figure 2A:
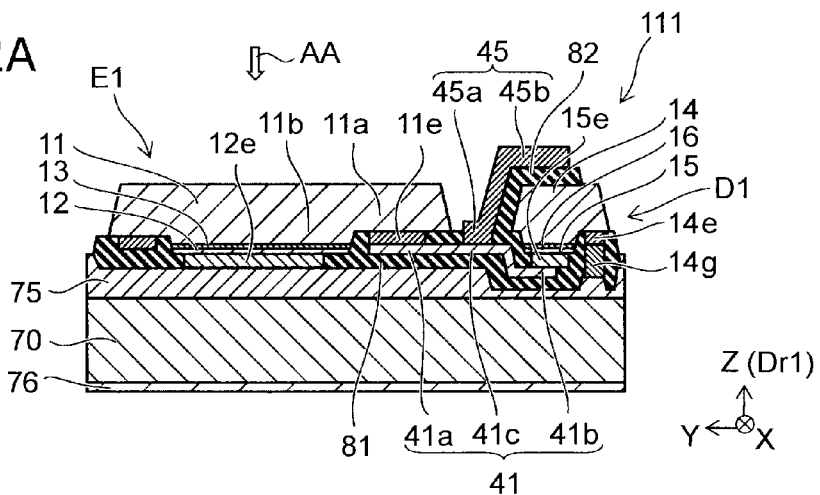
FIG. 2A to FIG. 2C are schematic plan views showing another semiconductor light emitting element according to the first embodiment.
Figure 2B:
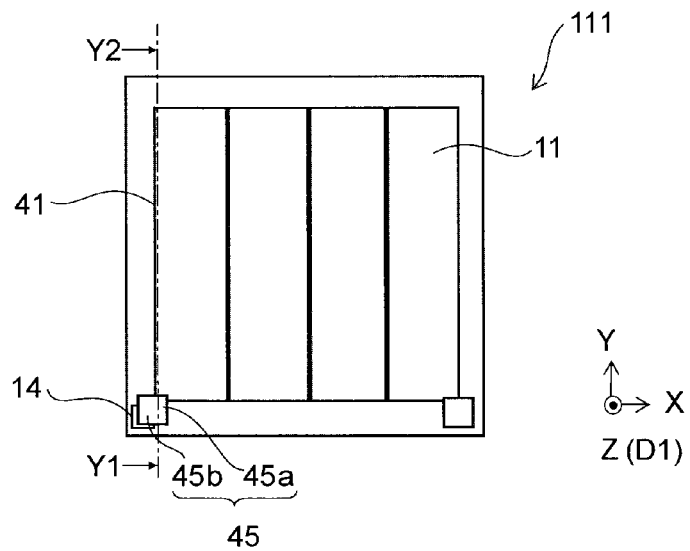
Figure 2C:
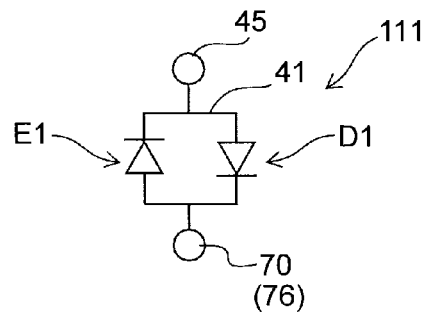

FIG. 2A to FIG. 2C are schematic plan views illustrating another semiconductor light emitting element according to the first embodiment.

FIG. 2A is a cross-sectional view along line Y1-Y2 of FIG. 2B. FIG. 2B is a plan view as viewed along arrow AA of FIG. 2A. FIG. 2C is an equivalent circuit diagram.

As shown in FIG. 2A, the semiconductor light emitting element 111 according to the embodiment includes the base body 70, the first to sixth semiconductor layers 11 to 16, the first conductive layer 41, and the first pad layer 45. The portions of the semiconductor light emitting element 111 that are different from those of the semiconductor light emitting element 110 will now be described.

As shown in FIG. 2A and FIG. 2B, the semiconductor light emitting element 111 further includes a second insulating layer 82. The first pad layer 45 further includes a second pad region 45b in addition to the first pad region 45a.

At least one portion of the fourth semiconductor layer 14 is provided between the second pad region 45b and the base body 70. At least one portion of the second insulating layer 82 is disposed between the second pad region 45b and the at least one portion of the fourth semiconductor layer 14 recited above.

Thus, in the semiconductor light emitting element 111, the first diode D1 and one portion of the first pad layer 45 overlap. Thereby, the surface area of at least one of the first light emitting unit E1 or the first diode D1 can be enlarged while ensuring the surface area of the first pad layer 45. Thereby, a high luminous efficiency is obtained.

When the first light emitting unit E1 emits light due to a forward voltage, a reverse voltage is applied to the first diode D1. At this time, the absorption of the emitted light by the first diode D1 is more notable. The carriers that are generated by the absorption of the emitted light reduce the current supplied to the light emitting unit. Thereby, the absorption of the emitted light by the first diode D1 reduces the luminous efficiency further. Accordingly, it is effective for the first diode D1 to be distal to the emitted light. It is effective for the first diode D1 to be shielded from the emitted light. In the semiconductor light emitting element 111, the first diode D1 is shielded by the first pad layer 45 (the second pad region 45b). Thereby, the suppression of the luminous efficiency is reduced.

In the semiconductor light emitting element 111 as well, the immunity to the reverse voltage can be improved while suppressing the degradation of the characteristics such as the luminous efficiency, light extraction efficiency, etc. An even higher efficiency is obtained.

Second Embodiment

Figure 3A:
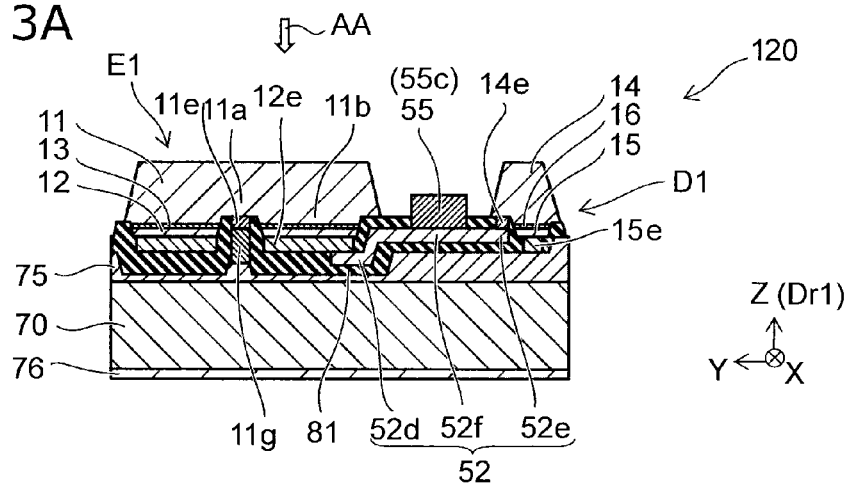
FIG. 3A to FIG. 3C are schematic plan views showing a semiconductor light emitting element according to a second embodiment.
Figure 3B:
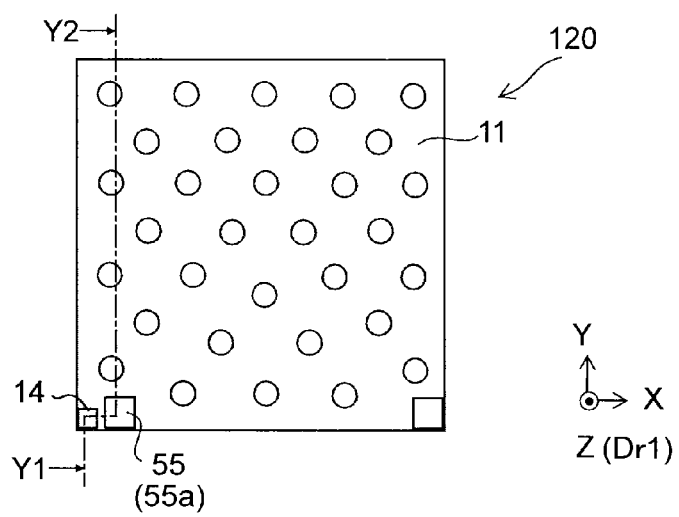
Figure 3C:
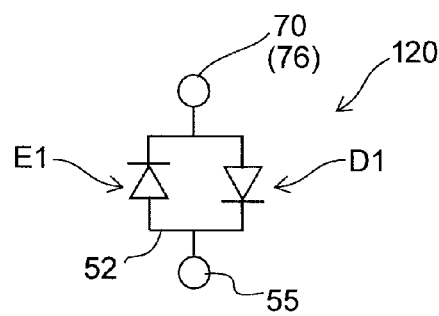

FIG. 3A to FIG. 3C are schematic plan views illustrating a semiconductor light emitting element according to a second embodiment.

FIG. 3A is a cross-sectional view along line Y1-Y2 of FIG. 3B. FIG. 3B is a plan view as viewed along arrow AA of FIG. 3A. FIG. 3C is an equivalent circuit diagram.

As shown in FIG. 3A, the semiconductor light emitting element 120 according to the embodiment includes the base body 70, the first to sixth semiconductor layers 11 to 16, a second conductive layer 52, and a second pad layer 55.

The base body 70 is conductive.

The first semiconductor layer 11 is of the first conductivity type and is separated from the base body 70 in the first direction Dr1. The first semiconductor layer 11 includes the first semiconductor region 11a, and the second semiconductor region 11b that is arranged with the first semiconductor region 11a in the second direction intersecting the first direction Dr1. In the second embodiment, the first semiconductor layer 11 is electrically connected to the base body 70.

The second semiconductor layer 12 is of the second conductivity type and is provided between the second semiconductor region 11b and the base body 70. The third semiconductor layer 13 is provided between the second semiconductor region 11b and the second semiconductor layer 12.

The fourth semiconductor layer 14 is of the first conductivity type, is separated from the base body 70 in the first direction Dr1, and is arranged with the first semiconductor region 11a in the third direction intersecting the first direction Dr1.

The fifth semiconductor layer 15 is provided between the base body 70 and one portion of the fourth semiconductor layer 14. In the second embodiment, the fifth semiconductor layer 15 is electrically connected to the base body 70. The fifth semiconductor layer 15 is of the second conductivity type. The sixth semiconductor layer 16 is provided between the fifth semiconductor layer 15 and the one portion of the fourth semiconductor layer 14 recited above.

The second conductive layer 52 includes a fourth conductive region 52d, a fifth conductive region 52e, and a sixth conductive region 52f. The fourth conductive region 52d is provided between the second semiconductor layer 12 and the base body 70. The fifth conductive region 52e is provided between the base body 70 and one other portion of the fourth semiconductor layer 14. The sixth conductive region 52f is provided between the fourth conductive region 52d and the fifth conductive region 52e. The second conductive layer 52 electrically connects the second semiconductor layer 12 to the fourth semiconductor layer 14.

The second pad layer 55 includes a third pad region 55c. The sixth conductive region 52f is disposed between the third pad region 55c and the base body 70. The third pad region 55c is electrically connected to the sixth conductive region 52f.

The first insulating layer 81 is further provided in the example. The first insulating layer 81 is provided between the second conductive layer 52 and the base body 70. The first insulating layer 81 electrically insulates the second conductive layer 52 from the base body 70.

In the example as well, the metal layer 75 and the metal film 76 are provided. The metal layer 75 is disposed between the first insulating layer 81 and the base body 70. The base body 70 is disposed between the metal film 76 and the metal layer 75. The metal film 76 is electrically connected to the base body 70. The metal layer 75 is electrically connected to the base body 70, the first semiconductor layer 11, and the fifth semiconductor layer 15.

The first to third semiconductor layers 11 to 13 are included in the first light emitting unit E1. The first light emitting unit E1 is the first LED. The electrode 11e and the electrode 12e are provided in the example. The electrode 11e is provided between the first semiconductor region 11a and the base body 70. For example, the electrode 11e is used as the cathode of the first light emitting unit E1. At least one portion of the electrode 12e is provided between the second semiconductor layer 12 and the fourth conductive region 52d. For example, the electrode 12e is used as the anode of the first light emitting unit E1. The fourth to sixth semiconductor layers 14 to 16 are included in the first diode D1. The electrode 14e and the electrode 15e are provided in the example. The electrode 14e is provided between the fifth conductive region 52e and one other portion of the fourth semiconductor layer 14. For example, the electrode 14e is used as the cathode of the first diode D1. The electrode 15e is provided between the fifth semiconductor layer 15 and the base body 70. For example, the electrode 15e is used as the anode of the first diode D1.

A conductive unit 11g is provided between the electrode 11e and the base body 70. The conductive unit 11g electrically connects the electrode 11e to the base body (the metal layer 75).

As shown in FIG. 3C, the cathode of the first light emitting unit E1 is electrically connected to the anode of the first diode D1 by the base body 70. The anode of the first light emitting unit E1 is electrically connected to the cathode of the first diode by the second conductive layer 52. The metal film 76 (the base body 70) is used as the cathode electrode of the semiconductor light emitting element 110. The second pad layer 55 is used as the anode electrode of the semiconductor light emitting element 110.

A voltage is applied between the metal film 76 (the base body 70) and the second pad layer 55 in the operation of the semiconductor light emitting element 120. A current is supplied to the first light emitting unit E1 from the second pad layer 55 toward the metal film 76 (the base body 70); and light is emitted from the first light emitting unit E1.

On the other hand, there are cases where the potential of the second pad layer 55 is lower than the potential of the metal film 76 (the base body 70) due to static electricity, lightning, etc. In other words, there are cases where a reverse voltage is applied. The current due to the reverse voltage flows through the first diode D1. The first diode D1 functions as a protection circuit. Thereby, the breakdown of the first light emitting unit E1 is suppressed.

In the embodiment, at least one portion of the second pad layer 55 (the third pad region 55c) is disposed between the first semiconductor layer 11 and the fourth semiconductor layer 14. For example, the first light emitting unit E1 is provided mainly in the central portion of the chip of the semiconductor light emitting element 120. On the other hand, the first diode D1 that functions as the protection circuit is provided at the edge of the chip. The second pad layer 55 is disposed between the first diode D1 and the first light emitting unit E1. Thereby, the surface area of the portion of the chip that emits light can be enlarged while suppressing the absorption. Thereby, the characteristics such as the luminous efficiency, light extraction efficiency, etc., can be improved.

Thus, in the embodiment, the immunity to the reverse voltage can be improved while suppressing the degradation of the characteristics. According to the embodiment, a semiconductor light emitting element having higher reliability can be provided.

Figure 4A:
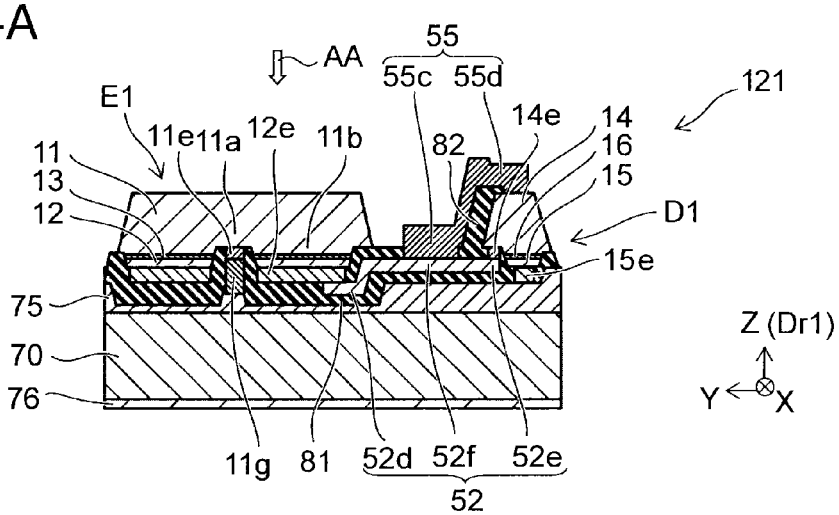
FIG. 4A to FIG. 4C are schematic plan views showing another semiconductor light emitting element according to the second embodiment.
Figure 4B:
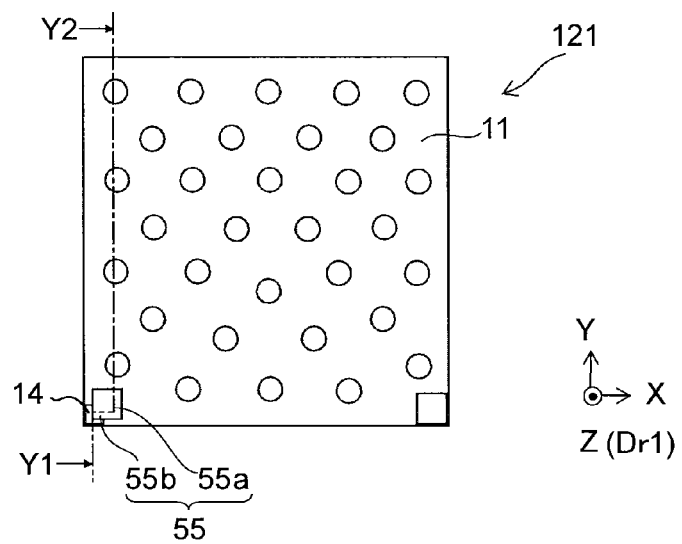
Figure 4C:
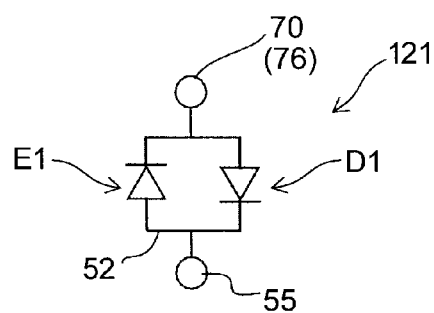

FIG. 4A to FIG. 4C are schematic plan views illustrating another semiconductor light emitting element according to the second embodiment.

FIG. 4A is a cross-sectional view along line Y1-Y2 of FIG. 4B. FIG. 4B is a plan view as viewed along arrow AA of FIG. 4A. FIG. 4C is an equivalent circuit diagram.

As shown in FIG. 4A, the semiconductor light emitting element 121 according to the embodiment includes the base body 70, the first to sixth semiconductor layers 11 to 16, the second conductive layer 52, and the second pad layer 55. The portions of the semiconductor light emitting element 121 that are different from those of the semiconductor light emitting element 120 will now be described.

As shown in FIG. 4A and FIG. 4B, the semiconductor light emitting element 121 further includes the second insulating layer 82. The second pad layer 55 further includes a fourth pad region 55d in addition to the third pad region 55c.

At least one portion of the fourth semiconductor layer 14 is provided between the fourth pad region 55d and the base body 70. At least one portion of the second insulating layer 82 is disposed between the second pad layer 55 and the fifth semiconductor layer 15 and between the second pad layer 55 and the sixth semiconductor layer 16.

Thus, in the semiconductor light emitting element 121, the first diode D1 and one portion of the second pad layer 55 overlap. Thereby, the surface area of at least one of the first light emitting unit E1 or the first diode D1 can be enlarged while ensuring the surface area of the second pad layer 55. Thereby, a high luminous efficiency is obtained.

In the semiconductor light emitting element 121 as well, the immunity to the reverse voltage can be improved while suppressing the degradation of the characteristics such as the luminous efficiency, light extraction efficiency, etc. An even higher efficiency is obtained.

Third Embodiment

Figure 5A:
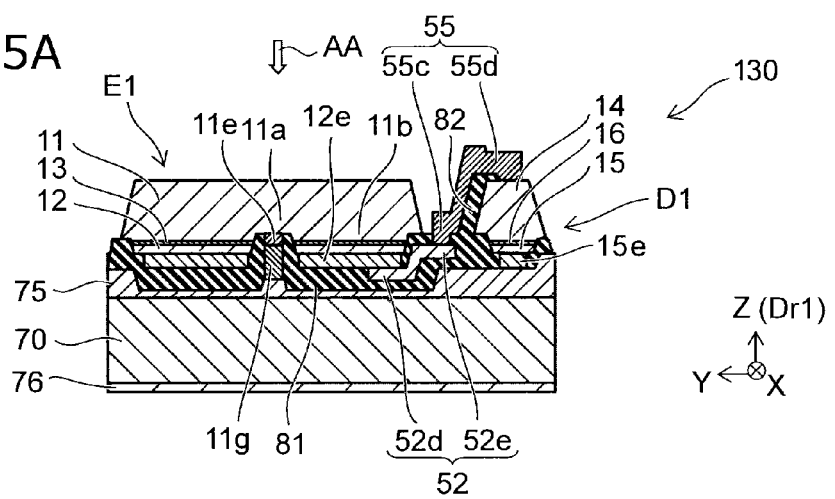
FIG. 5A to FIG. 5C are schematic plan views showing a semiconductor light emitting element according to a third embodiment.
Figure 5B:
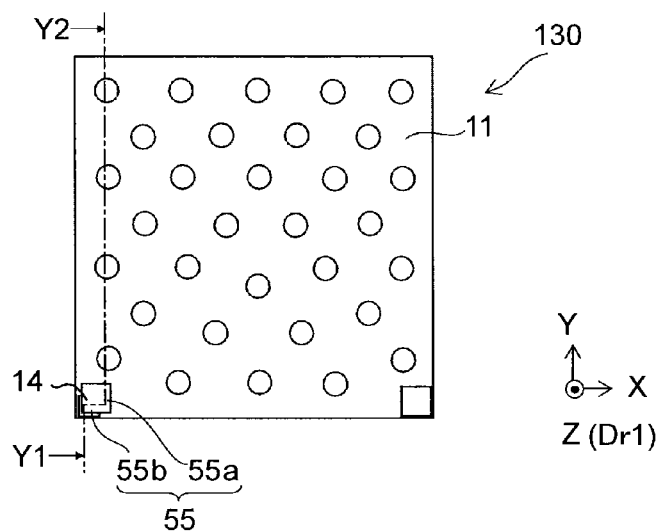
Figure 5C:
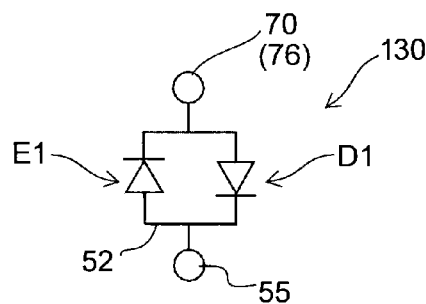

FIG. 5A to FIG. 5C are schematic plan views illustrating a semiconductor light emitting element according to a third embodiment.

FIG. 5A is a cross-sectional view along line Y1-Y2 of FIG. 5B. FIG. 5B is a plan view as viewed along arrow AA of FIG. 5A. FIG. 5C is an equivalent circuit diagram.

As shown in FIG. 5A, the semiconductor light emitting element 130 according to the embodiment includes the base body 70, the first to sixth semiconductor layers 11 to 16, the second conductive layer 52, and the second pad layer 55.

The base body 70 is conductive.

The first semiconductor layer 11 is of the first conductivity type and is separated from the base body 70 in the first direction Dr1. The first semiconductor layer 11 includes the first semiconductor region 11a, and the second semiconductor region 11b that is arranged with the first semiconductor region 11a in the second direction intersecting the first direction Dr1. In the embodiment as well, the first semiconductor layer 11 is electrically connected to the base body 70.

The second semiconductor layer 12 is provided between the second semiconductor region 11b and the base body 70. The third semiconductor layer 13 is provided between the second semiconductor region 11b and the second semiconductor layer 12.

The fourth semiconductor layer 14 is of the first conductivity type, is separated from the base body 70 in the first direction Dr1, and is arranged with the first semiconductor region 11a in the third direction intersecting the first direction Dr1.

The fifth semiconductor layer 15 is of the second conductivity type and is provided between the base body 70 and one portion of the fourth semiconductor layer 14. In the embodiment as well, the fifth semiconductor layer 15 is electrically connected to the base body 70. The sixth semiconductor layer 16 is provided between the fifth semiconductor layer 15 and the one portion of the fourth semiconductor layer 14 recited above.

The second conductive layer 52 includes the fourth conductive region 52d and the fifth conductive region 52e. The fourth conductive region 52d is provided between the second semiconductor layer 12 and the base body 70. The second conductive layer 52 electrically connects the second semiconductor layer 12 to the fourth semiconductor layer 14.

The second pad layer 55 includes the third pad region 55c and the fourth pad region 55d. The fifth conductive region 52e is disposed between the third pad region 55c and the base body 70. The third pad region 55c is electrically connected to the fifth conductive region 52e.

The third pad region 55c is disposed between the first semiconductor layer 11 and the fourth semiconductor layer 14. At least one portion of the fourth semiconductor layer 14 is disposed between the fourth pad region 55d and the base body 70.

Thus, in the semiconductor light emitting element 130, the second semiconductor layer 12 is connected to the fourth semiconductor layer 14 via the second conductive layer 52 and the second pad layer 55.

In the semiconductor light emitting element 130 as well, the first insulating layer 81 and the second insulating layer 82 are provided.

The first insulating layer 81 is provided between the second conductive layer 52 and the base body 70. The first insulating layer 81 electrically insulates the second conductive layer 52 from the base body 70.

The second insulating layer 82 is provided between the second pad layer 55 and the fifth semiconductor layer 15 and between the second pad layer 55 and the sixth semiconductor layer 16.

Otherwise, the configuration of the semiconductor light emitting element 130 is similar to that of the semiconductor light emitting element 121, and a description is omitted.

The first to third semiconductor layers 11 to 13 are included in the first light emitting unit E1. The fourth to sixth semiconductor layers 14 to 16 are included in the first diode D1. The cathode of the first light emitting unit E1 is electrically connected to the anode of the first diode D1 by the base body 70. The anode of the first light emitting unit E1 is electrically connected to the cathode of the first diode D1 by the second conductive layer 52. The metal film 76 (the base body 70) is used as the cathode electrode of the semiconductor light emitting element 130. The second pad layer 55 is used as the anode electrode of the semiconductor light emitting element 130.

In the semiconductor light emitting element 130 as well, the first diode D1 and one portion of the second pad layer 55 overlap. Thereby, the surface area of at least one of the first light emitting unit E1 or the first diode D1 can be enlarged while ensuring the surface area of the second pad layer 55. Thereby, a high luminous efficiency is obtained. In the semiconductor light emitting element 130 as well, the immunity to the reverse voltage can be improved while suppressing the degradation of the characteristics such as the luminous efficiency, light extraction efficiency, etc. An even higher efficiency is obtained.

Fourth Embodiment

FIG. 6A to FIG. 6C are schematic plan views illustrating a semiconductor light emitting element according to a fourth embodiment.

FIG. 6A is a cross-sectional view along line Y1-Y2 of FIG. 6B. FIG. 6B is a plan view as viewed along arrow AA of FIG. 6A. FIG. 6C is an equivalent circuit diagram.

As shown in FIG. 6A, the semiconductor light emitting element 140 according to the embodiment includes the first light emitting unit E1, a second light emitting unit E2, the first diode D1, a second diode D2, the first conductive layer 41, the second conductive layer 52, the first pad layer 45, the second pad layer 55, the first insulating layer 81, a first connection unit CP1, and a second connection unit CP2.

The base body 70 is, for example, conductive. In the embodiment, the base body 70 may be insulative.

The first light emitting unit E1 is provided on the base body 70. The first light emitting unit E1 includes a first anode A1 and a first cathode C1. The second light emitting unit E2 is provided on the base body 70. The second light emitting unit E2 includes a second anode A2 and a second cathode C2. The first diode D1 is provided on the base body 70. The first diode D1 includes a third anode A3 and a third cathode C3. The second diode D2 is provided on the base body 70. The second diode D2 includes a fourth anode A4 and a fourth cathode C4.

The first conductive layer 41 electrically connects the first cathode C1 to the third anode A3. The first conductive layer 41 includes the first conductive region 41a, the second conductive region 41b, and the third conductive region 41c. The third conductive region 41c is provided between the first conductive region 41a and the second conductive region 41b.

The first conductive region 41a is disposed between the first cathode C1 and the base body 70. The second conductive region 41b is disposed between the third anode A3 and the base body 70.

The second conductive layer 52 electrically connects the second anode A2 to the fourth cathode C4. The second conductive layer 52 includes the fourth conductive region 52d, the fifth conductive region 52e, and the sixth conductive region 52f. The sixth conductive region 52f is provided between the fourth conductive region 52d and the fifth conductive region 52e. The fourth conductive region 52d is disposed between the second anode A2 and the base body 70. The fifth conductive region 52e is disposed between the fourth cathode C4 and the base body 70.

The third conductive region 41c is disposed between the first pad layer 45 and the base body 70. The first pad layer 45 is electrically connected to the third conductive region 41c.

The sixth conductive region 52f is disposed between the second pad layer 55 and the base body 70. The second pad layer 55 is electrically connected to the sixth conductive region 52f.

The first insulating layer 81 is provided between the first conductive layer 41 and the base body 70 and between the second conductive layer 52 and the base body 70.

As shown in FIG. 6C, the first connection unit CP1 electrically connects the third cathode C3 to the base body 70. On the other hand, the second connection unit CP2 electrically connects the fourth cathode C4 to the base body 70.

As shown in FIG. 6A, the first direction Dr1 (the Z-axis direction) is the direction from the base body 70 toward the first diode D1.

As shown in FIG. 6A, the first light emitting unit E1 includes the first to third semiconductor layers 11 to 13. The first semiconductor layer 11 is of the n-type. The first semiconductor layer 11 includes the first semiconductor region 11a and the second semiconductor region 11b. The second semiconductor region 11b is arranged with the first semiconductor region 11a in the second direction intersecting the first direction Dr1.

The second semiconductor layer 12 is of the p-type and is provided between the second semiconductor region 11b and the base body 70. The third semiconductor layer 13 is provided between the second semiconductor region 11b and the second semiconductor layer 12.

The electrode 11e and the electrode 12e are provided in the example. The electrode 11e is used as the first cathode C1 of the first light emitting unit E1. The electrode 12e is used as the first anode A1 of the first light emitting unit E1. The electrode 11e is provided between the first semiconductor region 11a and the first conductive region 41a. The electrode 12e is provided between the second semiconductor layer 12 and the base body 70. In other words, the first anode A1 is provided between the second semiconductor layer 12 and the base body 70.

The first diode D1 includes the fourth to sixth semiconductor layers 14 to 16. The fourth semiconductor layer 14 is of the n-type. The fifth semiconductor layer 15 is of the p-type and is provided between the base body 70 and one portion of the fourth semiconductor layer 14. The sixth semiconductor layer 16 is provided between the fifth semiconductor layer 15 and the one portion of the fourth semiconductor layer 14 recited above.

The electrode 14e and the electrode 15e are provided in the example. The electrode 12e is used as the third cathode C3 of the first diode D1. The electrode 15e is used as the third anode A3 of the first diode D1. The electrode 14e is provided between the base body 70 and one portion of the fourth semiconductor layer 14. The electrode 15e is provided between the fifth semiconductor layer 15 and the second conductive region 41b. In other words, the third anode A3 is provided between the fifth semiconductor layer 15 and the second conductive region 41b.

The second light emitting unit E2 includes seventh to ninth semiconductor layers 17 to 19. The seventh semiconductor layer is of the n-type. The seventh semiconductor layer 17 includes a third semiconductor region 17a and a fourth semiconductor region 17b. The fourth semiconductor region 17b is arranged with the third semiconductor region 17a in the third direction intersecting the first direction Dr1.

The eighth semiconductor layer 18 is of the p-type and is provided between the fourth semiconductor region 17b and the base body 70. The ninth semiconductor layer 19 is provided between the fourth semiconductor region 17b and the eighth semiconductor layer 18.

An electrode 17e and an electrode 18e are provided in the example. The electrode 17e is used as the second cathode C2 of the second light emitting unit E2. The electrode 18e is used as the second anode A2 of the second light emitting unit E2. The electrode 17e is provided between the third semiconductor region 17a and the base body 70. The electrode 18e is provided between the eighth semiconductor layer 18 and the base body 70. In other words, the second anode A2 is provided between the eighth semiconductor layer 18 and the base body 70.

The second diode includes tenth to twelfth semiconductor layers 20 to 22. The tenth semiconductor layer 20 is of the n-type. The eleventh semiconductor layer 21 is of the p-type and is provided between the base body 70 and one portion of the tenth semiconductor layer 20. The twelfth semiconductor layer 22 is provided between the eleventh semiconductor layer 21 and the one portion of the tenth semiconductor layer 20 recited above.

An electrode 20e and an electrode 21e are provided in the example. The electrode 20e is used as the fourth cathode C4 of the second diode D2. The electrode 21e is used as the fourth anode A4 of the second diode D2. The electrode 20e is provided between the base body 70 and one portion of the tenth semiconductor layer 20. The electrode 21e is provided between the eleventh semiconductor layer 21 and the base body 70. In other words, the fourth anode A4 is provided between the eleventh semiconductor layer 21 and the base body 70.

The semiconductor light emitting element 140 further includes a first interconnect 61. The first interconnect 61 electrically connects the first light emitting unit E1 to the second light emitting unit E2. One portion of the first interconnect 61 is disposed between the first light emitting unit E1 and the base body 70 and is electrically connected to the first anode A1. One other portion of the first interconnect 61 is disposed between the second light emitting unit E2 and the base body 70 and is electrically connected to the second cathode C2.

As shown in FIG. 6B and FIG. 6C, the first interconnect 61 includes multiple light emitting units Es (LEDs) connected in series. Other than a conductor such as a metal, etc., the first interconnect 61 may include an LED including a semiconductor.

The first connection unit CP1 includes multiple first connection diodes Ds1 connected in series. The second connection unit CP2 includes multiple second connection diodes Ds2 connected in series. Thus, other than conductors such as metals, etc., the first connection unit CP1 and the second connection unit CP2 may include diodes including semiconductors.

In the example, the first connection unit CP1 includes a third diode D3, a second interconnect 62, and a third interconnect 63. The third diode D3 is provided on the base body 70. The third diode D3 includes a fifth anode A5 and a fifth cathode C5. The second interconnect 62 electrically connects the third cathode C3 to the fifth anode A5. The third interconnect 63 electrically connects the fifth cathode C5 to the base body 70. One portion of the second interconnect 62 is provided between the third cathode C3 and the base body 70. One other portion of the second interconnect 62 is provided between the fifth anode AS and the base body 70.

In the example, the third diode D3 includes thirteenth to fifteenth semiconductor layers 23 to 25. The thirteenth semiconductor layer 23 is of the n-type. The fourteenth semiconductor layer 24 is of the p-type and is provided between the base body 70 and one portion of the thirteenth semiconductor layer 23. The fifteenth semiconductor layer 25 is provided between the fourteenth semiconductor layer 24 and the one portion of the thirteenth semiconductor layer 23 recited above.

The second connection unit CP2 includes a fourth diode D4, a fourth interconnect 64, and a fifth interconnect 65. The fourth diode D4 is provided on the base body 70. The fourth diode D4 includes a sixth anode A6 and a sixth cathode C6. The fourth interconnect 64 electrically connects the fourth anode A4 to the sixth cathode C6. The fifth interconnect 65 electrically connects the sixth anode A6 to the base body 70. One portion of the fourth interconnect 64 is provided between the fourth anode A4 and the base body 70. One other portion of the fourth interconnect 64 is provided between the sixth cathode C6 and the base body 70.

In the example, the fourth diode D4 includes sixteenth to eighteenth semiconductor layers 26 to 28. The sixteenth semiconductor layer 26 is of the n-type. The seventeenth semiconductor layer 27 is of the p-type and is provided between the base body 70 and one portion of the sixteenth semiconductor layer 26. The eighteenth semiconductor layer 28 is provided between the seventeenth semiconductor layer 27 and the one portion of the sixteenth semiconductor layer 26 recited above.

In the semiconductor light emitting element 140, light is emitted from the first light emitting unit E1, the second light emitting unit E2, and the light emitting units Es. An appropriate voltage is applied to each of the multiple light emitting units by connecting the first light emitting unit E1, the second light emitting unit E2, and the light emitting units Es in series. Efficient light emission is obtained. The drive circuit is simple.

The first diode D1 and the second diode D2 function as protection circuits. The first connection diode Ds1 that is included in the first connection unit CP1 and the second connection diode Ds2 that is included in the second connection unit CP2 also function as protection circuits. By using the multiple diodes connected in series, the voltage is distributed to the multiple diodes. The function of the protection circuit for the reverse voltage improves.

In the semiconductor light emitting element 140 as well, the reliability can be increased.

For example, in the semiconductor light emitting element 140, the number of diodes (the number of diodes included in the first diode D1, the second diode D2, and the connection units) is set to be, for example, 8 when the number of light emitting units (the number of light emitting units included in the first light emitting unit E1, the second light emitting unit E2, and the light emitting units Es) is 12.

For example, the maximum value of the reverse voltage for one light emitting unit is taken to be 5 V. By connecting eight diodes in series, a reverse voltage of 40 V can be accommodated.

According to the embodiment, a semiconductor light emitting element having higher reliability can be provided. In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor light emitting elements such as base bodies, semiconductor layers, conductive layers, pad layers, metal layers, metal films, electrodes, connection units, etc., from known art. Such practice is included in the scope of the invention to the extent that similar effects thereto are obtained.

Moreover, all semiconductor light emitting elements practicable by an appropriate design modification by one skilled in the art based on the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
a base body, the base body being conductive;
a first semiconductor layer of a first conductivity type separated from the base body in a first direction, the first semiconductor layer including a first semiconductor region and a second semiconductor region, the second semiconductor region being arranged with the first semiconductor region in a second direction intersecting the first direction;
a second semiconductor layer of a second conductivity type provided between the second semiconductor region and the base body and electrically connected to the base body;
a third semiconductor layer provided between the second semiconductor region and the second semiconductor layer;
a fourth semiconductor layer of the first conductivity type separated from the base body in the first direction, arranged with the first semiconductor layer in a third direction, and electrically connected to the base body, the third direction intersecting the first direction;
a fifth semiconductor layer of the second conductivity type provided between the base body and one portion of the fourth semiconductor layer;
a sixth semiconductor layer provided between the fifth semiconductor layer and the one portion of the fourth semiconductor layer;
a first conductive layer electrically connecting the first semiconductor region to the fifth semiconductor layer and including a first conductive region, a second conductive region, and a third conductive region, the first conductive region being provided between the first semiconductor region and the base body, the second conductive region being provided between the fifth semiconductor layer and the base body, the third conductive region being provided between the first conductive region and the second conductive region; and
a first pad layer including a first pad region, the third conductive region being disposed between the first pad region and the base body, the first pad region being electrically connected to the third conductive region,
the first pad region being disposed between the first semiconductor layer and the fourth semiconductor layer.

2. The element according to claim 1, further comprising a first insulating layer provided between the first conductive layer and the base body, the first insulating layer electrically insulating the first conductive layer from the base body.

3. The element according to claim 2, further comprising a second insulating layer,
the first pad layer further including a second pad region,
at least one portion of the fourth semiconductor layer being provided between the second pad region and the base body,
at least one portion of the second insulating layer being disposed between the second pad region and the at least one portion of the fourth semiconductor layer.

4. The element according to claim 1, further comprising a metal layer provided between the first insulating layer and the base body.

5. A semiconductor light emitting element, comprising:
a base body, the base body being conductive;
a first semiconductor layer of a first conductivity type separated from the base body in a first direction and electrically connected to the base body, the first semiconductor layer including a first semiconductor region and a second semiconductor region, the second semiconductor region being arranged with the first semiconductor region in a second direction intersecting the first direction;
a second semiconductor layer of a second conductivity type provided between the second semiconductor region and the base body;
a third semiconductor layer provided between the second semiconductor region and the second semiconductor layer;
a fourth semiconductor layer of the first conductivity type separated from the base body in the first direction and arranged with the first semiconductor region in a third direction intersecting the first direction;
a fifth semiconductor layer of the second conductivity type provided between the base body and one portion of the fourth semiconductor layer and electrically connected to the base body;
a sixth semiconductor layer provided between the fifth semiconductor layer and the one portion of the fourth semiconductor layer;
a second conductive layer electrically connecting the second semiconductor layer to the fourth semiconductor layer and including a fourth conductive region, a fifth conductive region, and a sixth conductive region, the fourth conductive region being provided between the second semiconductor layer and the base body, the fifth conductive region being provided between the base body and one other portion of the fourth semiconductor layer, the sixth conductive region being provided between the fourth conductive region and the fifth conductive region; and
a second pad layer including a third pad region, the sixth conductive region being disposed between the third pad region and the base body, the third pad region being electrically connected to the sixth conductive region,
the third pad region being disposed between the first semiconductor layer and the fourth semiconductor layer.

6. The element according to claim 5, further comprising a first insulating layer provided between the second conductive layer and the base body, the first insulating layer electrically insulating the second conductive layer from the base body.

7. The element according to claim 6, further comprising a second insulating layer,
the second pad layer further including a fourth pad region,
at least one portion of the fourth semiconductor layer being provided between the fourth pad region and the base body,
at least one portion of the second insulating layer being disposed between the second pad layer and the fifth semiconductor layer and between the second pad layer and the sixth semiconductor layer.

8. A semiconductor light emitting element, comprising:
a base body, the base body being conductive,
a first semiconductor layer of a first conductivity type separated from the base body in a first direction and electrically connected to the base body, the first semiconductor layer including a first semiconductor region and a second semiconductor region, the second semiconductor region being arranged with the first semiconductor region in a second direction intersecting the first direction;

a second semiconductor layer of a second conductivity type provided between the second semiconductor region and the base body;

a third semiconductor layer provided between the second semiconductor region and the second semiconductor layer;

a fourth semiconductor layer of the first conductivity type separated from the base body in the first direction and arranged with the first semiconductor region in a third direction intersecting the first direction;

a fifth semiconductor layer of the second conductivity type provided between the base body and one portion of the fourth semiconductor layer and electrically connected to the base body;

a sixth semiconductor layer provided between the fifth semiconductor layer and the one portion of the fourth semiconductor layer;

a second conductive layer electrically connecting the second semiconductor layer to the fourth semiconductor layer and including a fourth conductive region and a fifth conductive region, the fourth conductive region being provided between the second semiconductor layer and the base body; and a second pad layer including a third pad region and a fourth pad region, the fifth conductive region being disposed between the third pad region and the base body, the third pad region being electrically connected to the fifth conductive region, the third pad region being disposed between the first semiconductor layer and the fourth semiconductor layer, at least one portion of the fourth semiconductor layer being disposed between the second pad layer and the base body.

9. The element according to claim 8, further comprising a first insulating layer provided between the second conductive layer and the base body, the first insulating layer electrically insulating the second conductive layer from the base body.

10. The element according to claim 9, further comprising a second insulating layer provided between the second pad layer and the fifth semiconductor layer and between the second pad layer and the sixth semiconductor layer.

11. A semiconductor light emitting element, comprising:
a base body;
a first light emitting unit provided on the base body, the first light emitting unit including a first anode and a first cathode;
a second light emitting unit provided on the base body, the second light emitting unit including a second anode and a second cathode;
a first diode provided on the base body, the first diode including a third anode and a third cathode;
a second diode provided on the base body, the second diode including a fourth anode and a fourth cathode;
a first conductive layer electrically connecting the first cathode to the third anode and including a first conductive region, a second conductive region, and a third conductive region, the third conductive region being disposed between the first conductive region and the second conductive region, the first conductive region being disposed between the first cathode and the base body, the second conductive region being disposed between the third anode and the base body;
a second conductive layer electrically connecting the second anode to the fourth cathode and including a fourth conductive region, a fifth conductive region, and a sixth conductive region, the sixth conductive region being disposed between the fourth conductive region and the fifth conductive region, the fourth conductive region being disposed between the second anode and the base body, the fifth conductive region being disposed between the fourth cathode and the base body;
a first pad layer, the third conductive region being disposed between the first pad layer and the base body, the first pad layer being electrically connected to the third conductive region;
a second pad layer, the sixth conductive region being disposed between the second pad layer and the base body, the second pad layer being electrically connected to the sixth conductive region;
a first insulating layer provided between the first conductive layer and the base body and between the second conductive layer and the base body;
a first connection unit electrically connecting the third cathode to the base body; and
a second connection unit electrically connecting the fourth cathode to the base body.

12. The element according to claim 11, wherein the first light emitting unit further includes:
a first semiconductor layer of an n-type, the first semiconductor layer including a first semiconductor region and a second semiconductor region, the second semiconductor region being arranged with the first semiconductor region in a second direction intersecting a first direction, the first direction being from the base body toward the first diode;
a second semiconductor layer of a p-type provided between the second semiconductor region and the base body; and
a third semiconductor layer provided between the second semiconductor region and the second semiconductor layer,
the first anode is provided between the second semiconductor layer and the base body,
the first diode further includes:
a fourth semiconductor layer of the n-type;
a fifth semiconductor layer of the p-type provided between the base body and one portion of the fourth semiconductor layer; and
a sixth semiconductor layer provided between the fifth semiconductor layer and the one portion of the fourth semiconductor layer, and
the third anode is provided between the fifth semiconductor layer and the second conductive region.

13. The element according to claim 12, wherein the second light emitting unit further includes:
a seventh semiconductor layer of the n-type, the seventh semiconductor layer including a third semiconductor region and a fourth semiconductor region, the fourth semiconductor region being arranged with the third semiconductor region in a third direction intersecting the first direction;
an eighth semiconductor layer of the p-type provided between the fourth semiconductor region and the base body; and a ninth semiconductor layer provided between the fourth semiconductor region and the eighth semiconductor layer, the second anode is provided between the eighth semiconductor layer and the base body, the second diode further includes:
- a tenth semiconductor layer of the n-type;
- an eleventh semiconductor layer of the p-type provided between the base body and one portion of the tenth semiconductor layer; and
- a twelfth semiconductor layer provided between the eleventh semiconductor layer and the one portion of the tenth semiconductor layer, and the fourth anode is provided between the eleventh semiconductor layer and the base body.

14. The element according to claim 11, further comprising a first interconnect,
- one portion of the first interconnect being disposed between the first light emitting unit and the base body and electrically connected to the first anode,
- one other portion of the first interconnect being disposed between the second light emitting unit and the base body and electrically connected to the second cathode.

15. The element according to claim 14, wherein
the first interconnect includes a plurality of light emitting units connected in series,
the first connection unit includes a plurality of first connection diodes connected in series, and
the second connection unit includes a plurality of second connection diodes connected in series.

16. The element according to claim 14, wherein
the first connection unit includes:
- a third diode provided on the base body, the third diode including a fifth anode and a fifth cathode;
- a second interconnect electrically connecting the third cathode to the fifth anode; and
- a third interconnect electrically connecting the fifth cathode to the base body.

17. The element according to claim 16, wherein
one portion of the second interconnect is provided between the third cathode and the base body, and one other portion of the second interconnect is provided between the fifth anode and the base body.

18. The element according to claim 16, wherein
the second connection unit includes:
- a fourth diode provided on the base body, the fourth diode including a sixth anode and a sixth cathode;
- a fourth interconnect electrically connecting the fourth anode to the sixth cathode; and
- a fifth interconnect electrically connecting the sixth anode to the base body.

19. The element according to claim 18, wherein
one portion of the fourth interconnect is provided between the fourth anode and the base body, and
one other portion of the fourth interconnect is provided between the sixth cathode and the base body.

20. The element according to claim 11, wherein a surface area of the first diode is not more than 1/50 of a surface area of the first light emitting unit.

* * * * *